United States Patent [19]
Takahashi

[11] Patent Number: 5,847,746
[45] Date of Patent: Dec. 8, 1998

[54] PROJECTION EXPOSURE APPARATUS INCLUDING A CONDENSER OPTICAL SYSTEM FOR IMAGING A SECONDARY LIGHT SOURCE AT POSITIONS DIFFERENT IN AN OPTICAL AXIS DIRECTION WITH RESPECT TO TWO CROSSING PLANES

[75] Inventor: Kazuhiro Takahashi, Utsunomiya, Japan

[73] Assignee: Canon Kabushiki Kaisha, Tokyo, Japan

[21] Appl. No.: 377,791

[22] Filed: Jan. 24, 1995

[30] Foreign Application Priority Data

Jan. 26, 1994 [JP] Japan .................................. 6-007036

[51] Int. Cl.⁶ ........................................................ B41J 2/47
[52] U.S. Cl. ................................................... 347/241
[58] Field of Search ................................. 347/258, 244, 347/241, 243, 134; 359/204, 205, 209

[56] References Cited

U.S. PATENT DOCUMENTS

| | | | |
|---|---|---|---|
| 4,617,469 | 10/1986 | Takahashi et al. | 250/548 |
| 4,659,225 | 4/1987 | Takahashi | 356/358 |
| 4,682,885 | 7/1987 | Torigoe . | |
| 4,851,882 | 7/1989 | Takahashi et al. . | |
| 4,874,954 | 10/1989 | Takahashi et al. | 250/548 |
| 4,974,919 | 12/1990 | Muraki et al. | 359/204 |
| 5,091,744 | 2/1992 | Omata | 355/53 |
| 5,097,291 | 3/1992 | Suzuki | 355/69 |
| 5,121,160 | 6/1992 | Sano et al. . | |
| 5,153,773 | 10/1992 | Muraki et al. | 359/24 |
| 5,263,250 | 11/1993 | Nishiwaki et al. | 29/890.1 |

FOREIGN PATENT DOCUMENTS 0486316  5/1992  European Pat. Off. .

*Primary Examiner*—Mark J. Reinhart
*Attorney, Agent, or Firm*—Fitzpatrick, Cella, Harper & Scinto

[57] ABSTRACT

A projection exposure apparatus includes a projection optical system for projecting a pattern of a first object onto a second object; a laser source; an optical integrator for forming a secondary light source from the laser source; and a condenser optical system for imaging the secondary light source behind the first object at positions different in a direction of an optical axis with respect to two different directions to illuminate the first object therewith.

13 Claims, 10 Drawing Sheets

PROJECTION EXPOSURE APPARATUS INCLUDING A CONDENSER OPTICAL SYSTEM FOR IMAGING A SECONDARY LIGHT SOURCE AT POSITIONS DIFFERENT IN AN OPTICAL AXIS DIRECTION WITH RESPECT TO TWO CROSSING PLANES

FIELD OF THE INVENTION AND RELATED ART

The present invention relates to a projection exposure apparatus and a device manufacturing method for manufacturing various devices using the projection exposure apparatus, usable for manufacturing a semiconductor device such as an IC or LSI, a display device such as a liquid crystal panel, a magnetic head or the like.

Recently, the density of a semiconductor device such as an IC or LSI is acceleratedly increased, and the resultant development for the fine processing for a semiconductor wafer is also remarkable. The projection exposure technique, which is the key part of the fine processing, is under development for an increase of the resolution to form an image of a dimension not more than 0.5 $\mu$m. The increase of the resolution is directed, in the projection exposure optical system, to an increase of the NA (numerical aperture) or a decrease of the wavelength of the exposure beam.

With the decrease of the wavelength of the exposure light, the transmissivity of the glass material decreases, and therefore, the kinds of the glass, materials usable for the projection optical system decreases in number. When the number of kinds of the glass materials decreases, the correction of the chromatic aberration becomes difficult, and therefore, it is desired to reduce the wavelength band width of the light source to such an extent that the resultant chromatic aberration is negligibly small. For example, in the projection optical system using light having a wavelength of 300 nm or less, the usable glass materials are quartz and fluorite, and the light source provides a narrow band laser beam. When a laser is used as a light source, a plurality of spots are formed on a pupil of the projection optical system from a single spot to which the laser beam is condensed, since the laser beam has high directivity. The energy density is very high in the spot, and when an optical element is disposed at this position, the glass material or coating thereof is deteriorated by the laser spot, or damaged by long term illumination. If this occurs, the transmissivity of the glass material decreases, and the property of the coating is changed. In order to avoid this problem, it would be considered that the lens or a concave mirror is not disposed adjacent the pupil plane of the projection optical system.

However, when the NA of the optical system is increased for the purpose of increasing the resolution, or when the size of the field of the image is increased, with the result of an increase of the number of lenses constituting the optical system, it is difficult to provide a space without an optical element in the neighborhood of the pupil plane.

SUMMARY OF THE INVENTION

Accordingly, it is a principal object of the present invention to provide a projection exposure apparatus and a device manufacturing method using the same in which the density of the energy of the laser beam condensed in the optical system can be reduced.

According to a first aspect of the present invention, there is provided a projection exposure apparatus and a device manufacturing method including a projection optical system for projecting a pattern of a first object onto a second object, and an illumination system for illuminating the pattern on the first object, wherein the illumination optical system includes a laser beam source and an illumination optical system for illuminating the surface of the first object with the beam from the laser source and for condensing the light beam from the laser source at different plural positions in the optical axis direction of the projection optical system, behind the first object plane. Thus, the surface of the first object is illuminated with the laser beam, and the laser beam is condensed at the positions different in the optical axis direction of the projection optical system, and therefore, the laser beam does not form a spot adjacent the pupil plane, thus reducing the energy density of the laser beam so that the durability of the apparatus is improved.

According to a second aspect of the present invention, there is provided a projection exposure apparatus comprising: a projection optical system for projecting a pattern of a first object onto a second object; a laser source; an optical integrator for forming a secondary light source from the laser source; and a condenser optical system for imaging the secondary light source behind the first object at positions different in a direction of an optical axis with respect to two different directions to illuminate the first object therewith.

The surface of the first object is illuminated by the beam from the secondary light source, and the beam from the secondary light source is focused at positions different in the optical axis direction in two different directions, behind the first object surface, by the condenser optical system. Since the surface of the first object is illuminated by the beam from the secondary light source of the optical integrator, the first object surface can be illuminated with a uniform illumination intensity. In addition, the laser beam is prevented from forming a spot adjacent the pupil plane. Thus, the energy density of the laser beam is reduced, and therefore, the durability of the apparatus is improved.

According to a third aspect of the present invention, there is provided a projection exposure apparatus comprising: a projection optical system for projecting a pattern of a first object onto a second object; a laser source; an optical integrator for forming a secondary light source from rays of the laser source; a condenser lens for illuminating the first object with rays from the secondary light source; wherein the optical integrator comprises a plurality of lenses disposed such that rear focus positions are a predetermined distance away from each other in two orthogonal directions, wherein the rays are condensed behind the first object at positions different in a direction of an optical axis in the two directions through the condenser optical system.

According to this feature, the surface of the first object is illuminated by the beam from the secondary light source of the optical integrator, and therefore, the surface of the object can be illuminated with a uniform illumination intensity. By preventing spot formation of the laser beam adjacent the pupil plane, the energy density of the laser beam is reduced, so that the durability of the apparatus is increased. Additionally, since the plural light sources for providing the secondary light source have a linear configuration, it is effective to form an illumination area in the form of a slit.

According to a fourth aspect of the present invention, there is provided a projection exposure apparatus and a device manufacturing method, including a projection optical system for projecting a pattern of a first object onto a second object, and an illumination system for illuminating the pattern on the first object, and the illumination system includes a laser light source as a light source, and an illumination optical system or condensing the beam from the laser source at positions different in the optical axis direction of the projection optical system to illuminate the first object surface, wherein a beam condensing position in a direction perpendicular to the scanning direction is on the pupil plane of the projection optical system, whereas the condensing position in a plane including the scanning direction is deviated from the pupil position of the projection optical system. In the plane including the scanning direction, the condensing position of the laser beam is deviated from the pupil plane of the projection optical system. The illumination beam (image formation beam) will be deviated (tilted) depending on the image height, but adjacent the optical axis of the projection optical system (in front of and at the back of the optical axis in the scanning direction), the scanning exposure is effected, by which the deviation of the illumination beam in the scanning direction is made even, so that the exposure can be effected without deviation of the beam.

According to a fifth aspect of the present invention, the third aspect is improved in that a rear focus position in a direction perpendicular to the scanning direction of the optical integrator constituted by a plurality of lenses disposed such that the rear focus positions are deviated through a predetermined distance in the optical axis direction, in two orthogonal directions, is optically conjugate with the pupil plane of the projection optical system, and the rear focus position in the scanning direction is not in optical conjugation with the pupil plane of the projection optical system. In the plane including the scanning direction, the image position of the secondary light source provided by the optical integrator is deviated from the pupil plane of the projection optical system. Therefore, the illumination beam (imaging beam) is deviated (tilted) depending on the image height. The deviation can be made even in the scanning direction by effecting the scanning exposure adjacent the optical axis of the projection optical system (in front of and at the back of the optical axis in the scanning direction), by which the exposure is possible with the beam without the deviation.

According to a sixth aspect of the present invention, there is provided a projection exposure apparatus, and a device manufacturing method, which includes a projection optical system for projecting the pattern on the first object onto the second object and an illumination system for illuminating the pattern of the first object, and the illumination system includes a laser source, and an illumination optical system for condensing the light beam from the laser source at positions different in the direction of the optical axis of the projection optical system behind the first object to illuminate the first object surface with the laser beam from the laser source, and the illumination optical system is effective to condense the beam from the laser source at a position of the pupil plane of the projection optical system and a position deviated therefrom. By doing so, the energy density of the laser beam can be increased by avoiding the spot formation adjacent the pupil plane, thus improving the durability of the apparatus. Additionally, the reduction of the imaging performance is avoided by placing one condensing position at the pupil plane.

According to a seventh aspect of the present invention, there is provided a projection exposure apparatus, and a device manufacturing method, which comprises a projection optical system for projecting a pattern of a first object onto a second object and an illumination system for illuminating the pattern of the first object, and the illumination system includes a laser source and an illumination optical system for condensing the light beam from the laser source at positions different in the direction of the optical axis of the projection optical system, behind the first object surface to illuminate the surface of the first object with the beam from the laser source. By doing so, the spot formation of the laser beam is prevented adjacent the pupil plane, thus decreasing the energy density of the laser beam, by which the durability of the apparatus is improved, and by using an illumination optical system producing astigmatism, by which the beam from the light source is condensed into a linear shape at different positions, thus further reducing the energy density.

According to an eighth aspect of the present invention, the sixth and the seventh aspect are further improved in that the first and the second objects are scanned by the laser beam from the laser source so that each part of the pattern of the first object is sequentially projected onto the second object, and an illumination optical system condenses the light from the laser source at a position of the pupil plane in a plane including the optical axis and a direction perpendicular to the scanning direction, and condenses the light from the laser source at a position away from the pupil plane in a plane containing the optical axis and the scanning direction. By doing so, the energy density of the laser beam can be reduced without reduction of the imaging performance.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
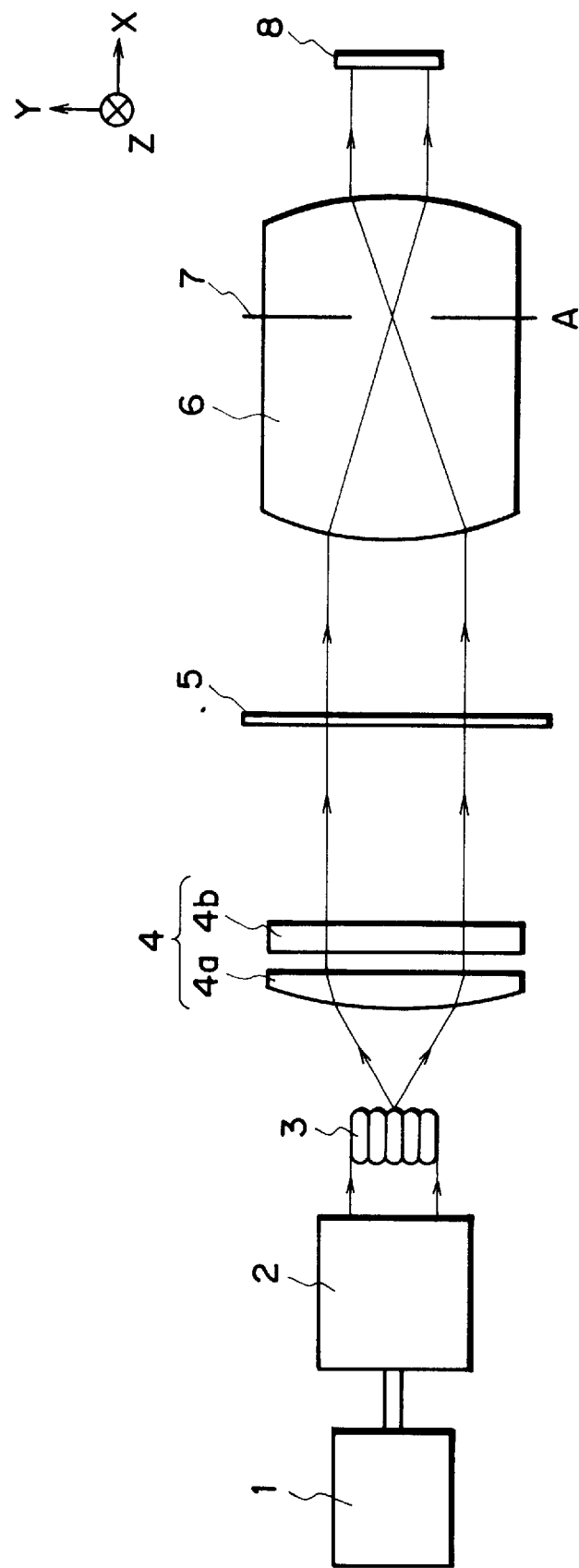
FIG. 1 illustrates an apparatus according to a first embodiment of the present invention in an XY plane.
Figure 2:
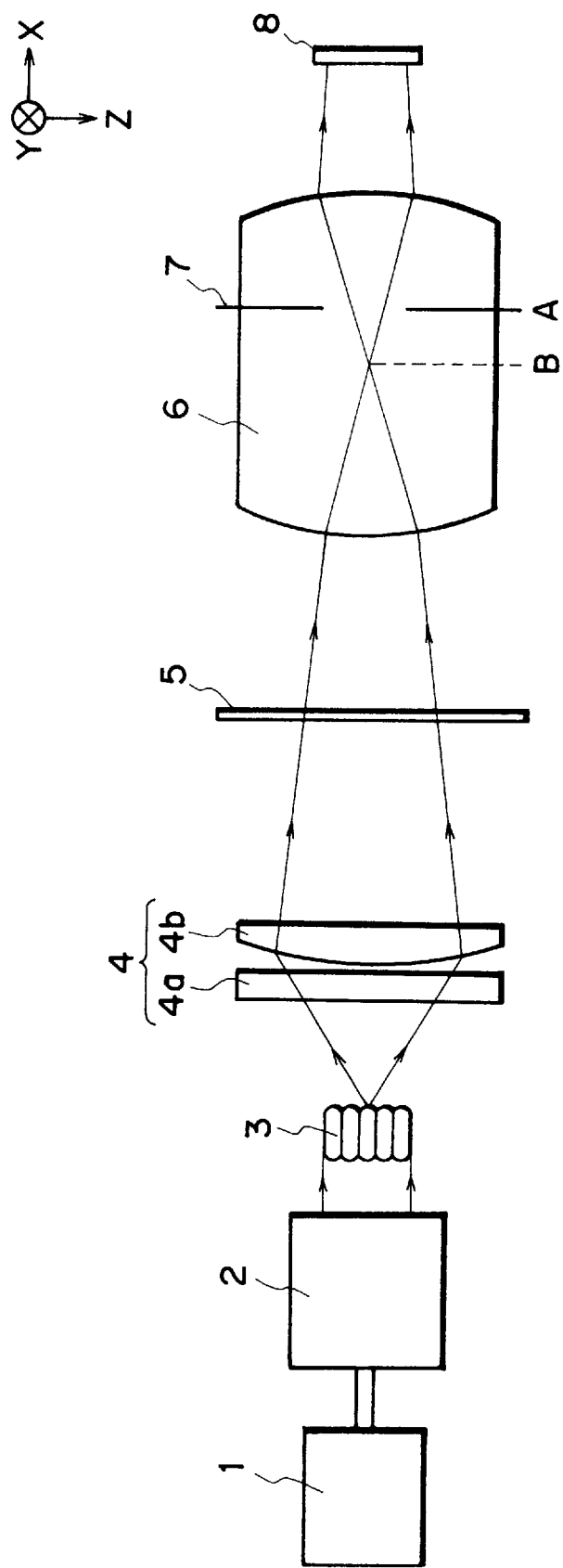
FIG. 2 shows the same in a ZX plane.

FIGS. 1 and 2 schematically show a projection exposure apparatus usable for manufacturing a semiconductor device such as an IC or LSI, an image pickup device such as a CCD, a display device such as a liquid crystal panel, a magnetic head or the like, according to a first embodiment of the present invention. In FIGS. 1 and 2, the direction of the optical axis is represented by "X", and FIG. 1 is a view in an XY plane, and FIG. 2 shows the same in a ZX plane.

In FIG. 1, a substantially collimated laser beam emitted from the laser source 1 is incident on a device 2 for making the beam incoherent. In the device 2, the shape of the laser beam emitted from the laser source 1 is reformed to match the shape of the optical integrator 3, and divide or scan the laser beam so that no speckle pattern or other interference fringes, are formed on the wafer 8. The light passing through the device 2 is incident on the optical integrator 3 and is divided into a number of light beams thereby, into a number of scattering beams. In other words, the light emitting surface of the optical integrator 3 functions as a secondary light source, and a number of scanning beams from the secondary light source is incident on a condenser lens 4, which in turn are overlaid on the reticle 5 to effect uniform illumination.

The condenser lens 4 comprises a cylindrical lens 4*a* and 4*b*. In the XY plane, the lens 4*a* has a refraction power, but the lens 4*b* has no refraction power in this plane. The light rays from the secondary light source are overlaid on the surface, to be illuminated, of the reticle 5 by the condenser lens 4*a*. At this time, if the projection optical system 6 is a telecentric optical system, the principal ray of the illumination is incident on the reticle 5 in the form of afocal light, and forms an image of the secondary light source in the XY plane on a pupil plane 7 of the projection optical system 6. The reticle 5 has a circuit pattern of a semiconductor device to be transferred onto the wafer 8, so that the projection optical system 6 forms an image of the circuit pattern on the wafer 8, and therefore, the pattern image is transferred thereonto.

FIG. 2 is a view in a ZX plane (as seen perpendicular to the sheet of the drawing of FIG. 1), and the lens 4*a* of the condenser lens 4 is a cylindrical lens not having a refraction power in the XY plane, but it has a refraction power in the ZX plane. The light rays from the secondary light source in the emitting side surface of the optical integrator 3 are overlaid on the reticle 5 by the condenser lens 4*b*. The condenser lens forms an image of the secondary light source in the ZX plane at a position B away from the pupil plane 7 of the projection optical system 6 by a predetermined distance. Each principal ray of the illumination light incident on each point on the reticle 5, is parallel in the XY plane of FIG. 1, but is inclined at a predetermined angle toward the optical axis in the ZX plane of FIG. 2, so that the light is converged as shown in the Figure.

Figures 3A, 3B:
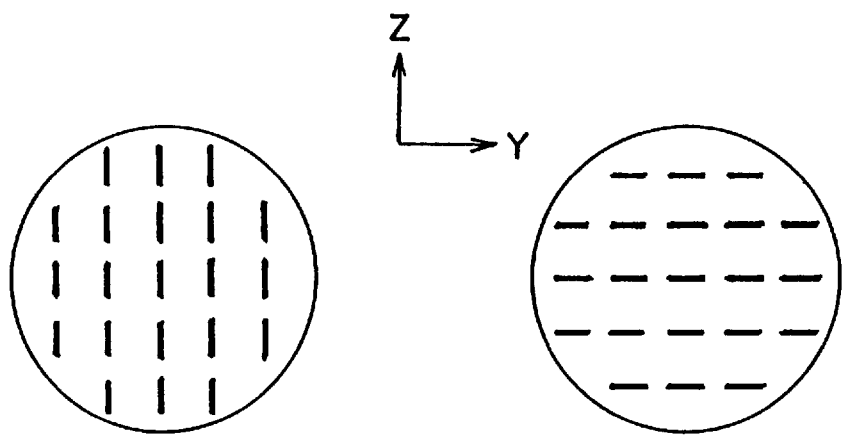
FIGS. 3A and 3B show a pupil plane of the projection optical system according to the first embodiment and an image of a secondary light source at a position a predetermined distance away from the pupil plane.

FIGS. 3A and 3B show images of the light source in a plane perpendicular to the optical axis at a position A at the pupil plane 7 (aperture position) of the projection optical system 6 and at a position B away from the position A. In FIG. 3A, the light from the optical integrator 3 is converged in the Y direction, but is diverged in the Z direction to a predetermined degree. On the other hand, in FIG. 3B, it is converged in the Z direction but is diverged in the Y direction, contrary to FIG. 3A. The shapes of the secondary light sources formed in the projection optical system 6 shown in FIGS. 3A and 3B, are dependent on the structure of the shape of the optical integrator 7 and the structure of the device 2.

As described, the projection exposure apparatus of this embodiment uses an anamorphic illumination optical system having a different focal length in two orthogonal directions so that the astigmatism is provided for the formation of images of the secondary light source within the projection optical system, by which linear spots are formed at positions A and B. Thus, no spot is formed at any position in the projection optical system 6 by the light from the laser source, thus avoiding an occurrence of high energy density projection. Therefore, the durability of the optical system 6 and therefore, the apparatus, is increased. This advantageous effect is provided in the other embodiments of the present invention.

Figure 4:
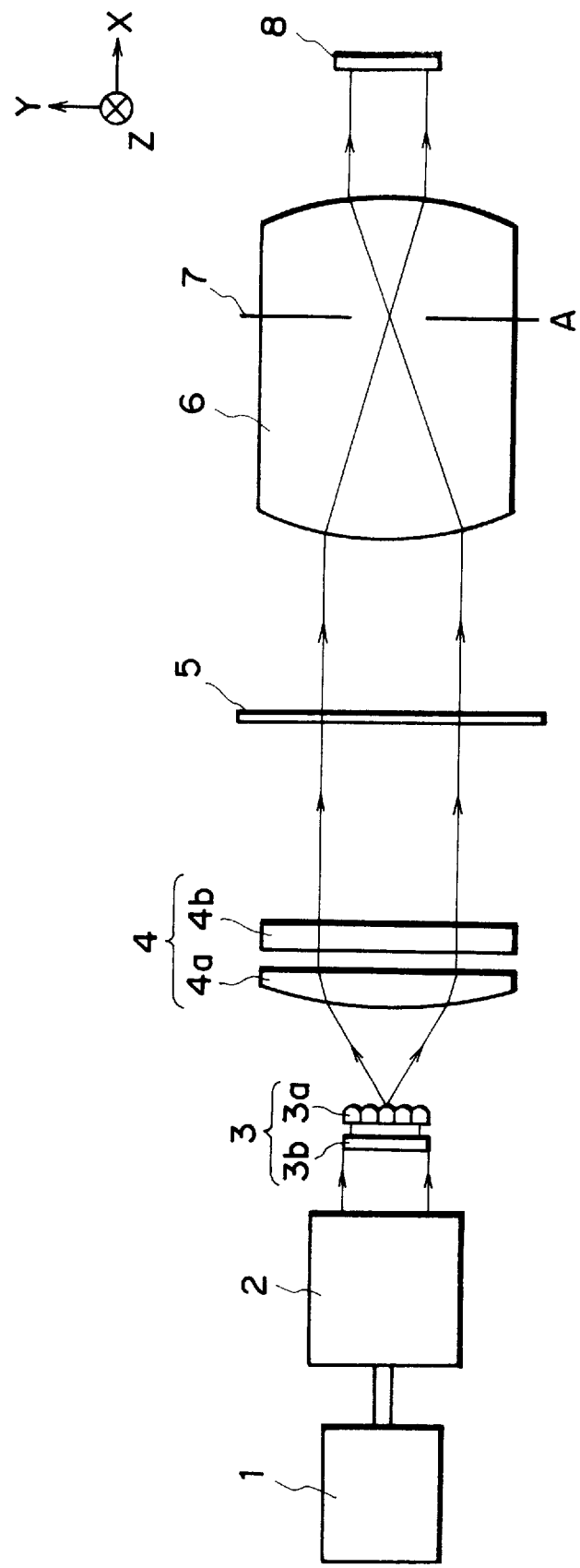
FIG. 4 illustrates a second embodiment in an XY plane.
Figure 5:
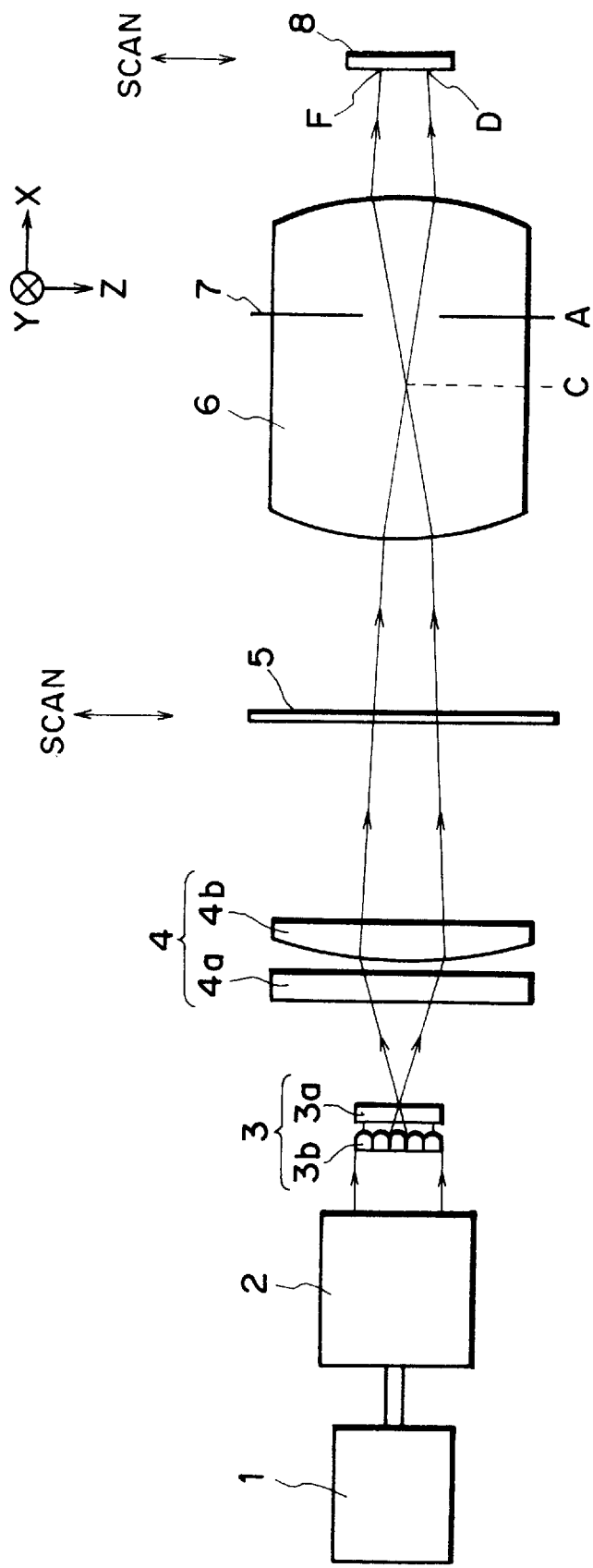
FIG. 5 illustrates the second embodiment in a ZX plane.

FIGS. 4 and 5 illustrate a projection exposure apparatus usable for manufacturing devices such as a semiconductor device such as an IC or LSI, an image pickup device such as a CCD, a display device such as a liquid crystal device, a magnetic head or the like, according to a second embodiment of the present invention. In this embodiment, the scanning operation is effected in the direction indicated by an arrow in FIG. 5 in synchronism with the reticle 5 and the wafer 8, so that the wafer 8 is exposed through the pattern of the reticle 5. Therefore, the present invention is applied to a scanning type exposure apparatus.

In the scanning type exposure apparatus, the shape of the illumination area on the wafer and on the reticle 5, is slit-like. The optical integrator 3 is constructed by a cylindrical lens or the like having a different refraction power in the two orthogonal directions perpendicular to the optical axis, by which a plurality of slit-like light sources are formed on the secondary light source surface. The longitudinal directions of the slit light source and the illumination area are made the same, by which the illumination area can be illuminated efficiently by the slit-like light.

In this embodiment, the optical integrator 3 is constituted by cylindrical lenses 3*a* and 3*b*. The cylindrical lens 3*a* has a refraction power in an XY plane, and the light is collimated by a condenser lens 4*a* to illuminate in the longitudinal direction the slit like illumination area of the reticle 5. On the other hand, a cylindrical lens 4*b* has a refraction power in a ZX plane, and the condenser lens 4*b* is effective to illuminate the slit-like illumination area in a width (scanning direction).

In FIG. 4, the secondary light source formed on the emitting surface of the optical integrator 3 is formed on a pupil plane of the projection optical system 6 by the condenser lens 4*a* in the XY plane.

In FIG. 5, there is shown a positional relationship between the secondary light source and the pupil plane of the projection optical system 6 in the ZX plane, including the scanning direction. In the ZX plane, the emitting surface of the optical integrator 3 is imaged at a position C which is a predetermined distance away from the pupil plane 7 in the optical axis direction, by the condenser lens 4*b*. The image of the secondary light source on the pupil plane 7 in FIG. 4 has the same distribution as shown in FIG. 3A, and the image of the secondary light source at a position C in FIG. 5, has the same distribution as in FIG. 3B, in embodiment 1, so that there is no high energy density position resulting from a converged spot image.

In FIG. 5, if it is assumed that the projection optical system 6 is telecentric at a light emitting side (wafer 8 side), the principal ray is incident with an angle relative to the optical axis at positions D and E on the wafer. Generally, when the principal ray is incident with inclination, the size of the image changes if the wafer 8 is exposed with defocusing. However, in the embodiment of FIG. 5, the sequential exposure is carried out while scanning in the direction of the arrow, and therefore, the inclination of the principal ray is made uniform by the scanning exposure from a position D to a position E, and therefore, the size of the image remains the same despite the defocusing.

Accordingly, when the present invention is used in the scanning type exposure apparatus, it is desirable that the secondary light source is imaged on the pupil plane of the projection optical system in a plane including the optical axis direction and a longitudinal direction of the slit (perpendicular to the scanning direction), and the image of the secondary light source is formed at a position a predetermined distance away from the pupil plane of the projection optical system in a plane including the scanning direction and the optical axis direction.

Figure 6:
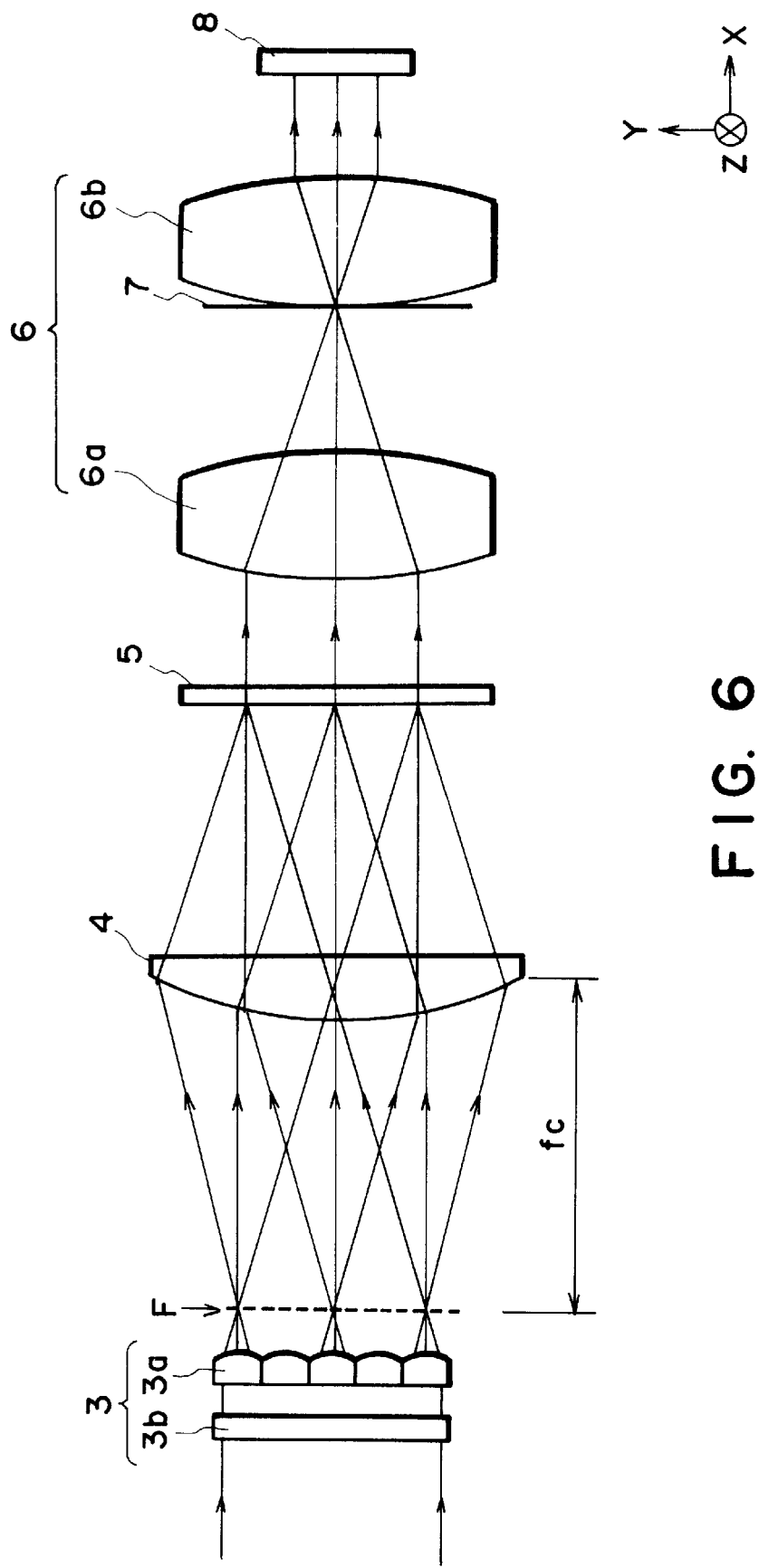
FIG. 6 illustrates a system according to a third embodiment in an XY plane.
Figure 7:
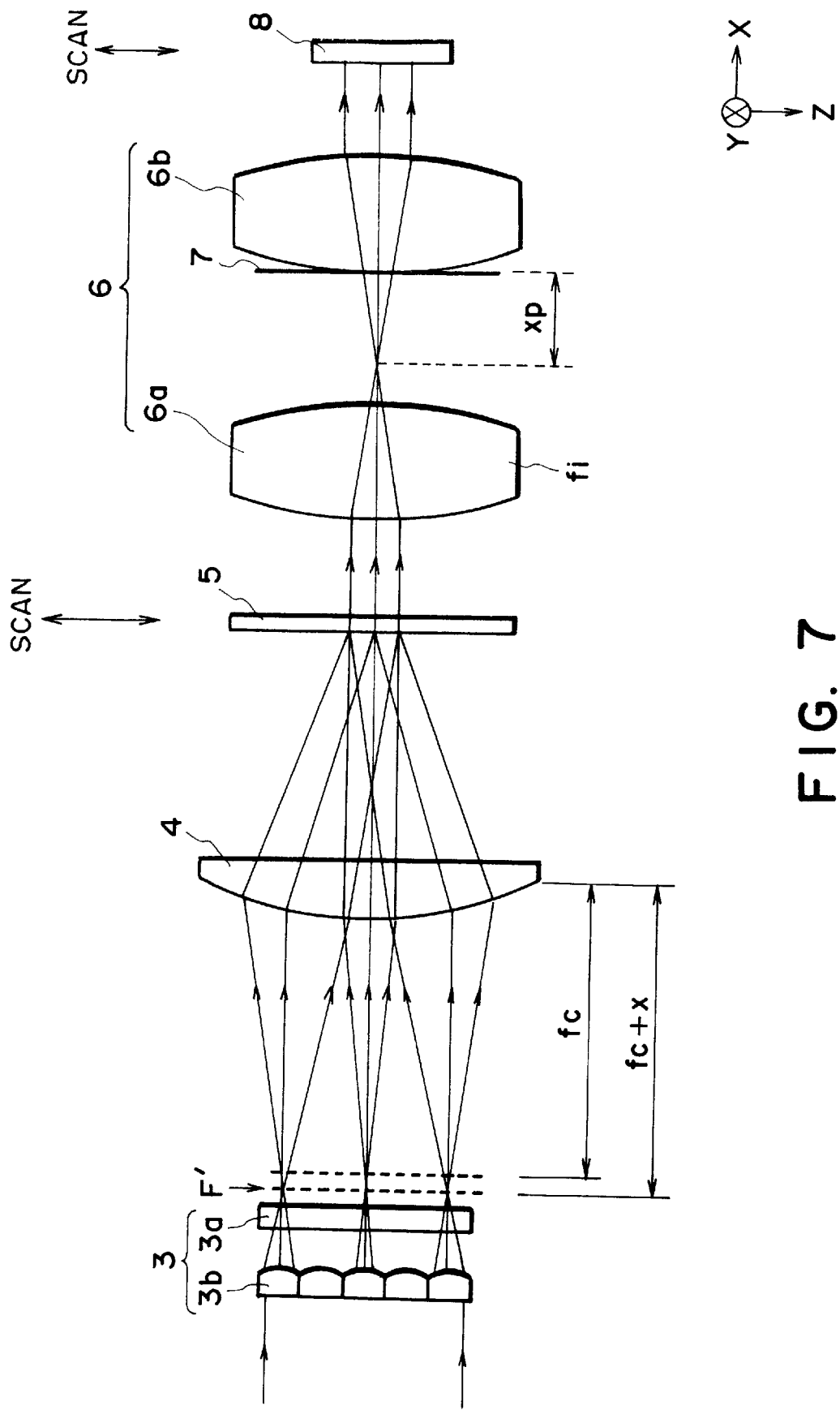
FIG. 7 illustrates the system of the third embodiment in a ZX plane.

FIGS. 6 and 7 show a projection exposure apparatus usable for manufacturing devices such as a semiconductor device such as an IC or LSI, an image pickup device such as a CCD, a display device such as a liquid crystal panel, a magnetic head or the like. The structures of the exposure apparatus are substantially the same as in the first and second embodiments, and therefore, only the optical system downstream of the optical integrator 3 is shown. In this embodiment, the condenser lens 4 in the illumination system comprises a rotation symmetry lens having a uniform refraction power. The optical integrator 3 comprises a plurality of cylindrical lenses 3a and 3b so that the rear focus positions are deviated from each other in the direction of the optical axis by a predetermined distance, in two orthogonal directions.

FIG. 6 is a view as seen in the XY plane of the apparatus according to the third embodiment of the present invention. In FIG. 6, the optical integrator 3A is in the form of a group of cylindrical lenses having refraction powers in the XY plane to converge the laser beam from the laser source 1 at a rear focus position F. The optical integrator 3b does not have a refraction power in the XY plane, and is constituted by cylindrical lenses overlaid in the direction perpendicular to the sheet of the drawing. The condenser lens 4 has a focal length fc, and the projection optical system 6 is telecentric relative to the object (reticle) side. In this case, the rear focus position F is a distance fc away from the condenser lens 4. In this case, the secondary light source formed at the position F is formed on the pupil plane 7 of the projection optical system in the XY plane.

FIG. 7 is a view as seen in the ZX plane of the apparatus of the third embodiment. The optical integrator 3b has a refraction power in the ZX plane, and the laser beam is condensed at a position of the rear focus position F' to form a secondary light source there. The rear focus position F' is (fc+X) away from the condenser lens. Therefore, the secondary light source in the ZX plane is imaged at a position a predetermined distance (xp) away from the pupil plane 7 of the projection optical system 6. Here, the following is satisfied:

$$xp=(fi/fc)^2 \times X$$

where fi is a focal length of the lens group 6a in front of the projection optical system 6.

Similar to the first and second embodiments, the image of the secondary light source in the pupil plane 7 of the projection optical system 6 in FIG. 6 is slit-like in the third embodiment, too. Additionally, the secondary light source image at the image position adjacent the pupil plane 7 in he ZX plane in FIG. 7, is slit-like, as shown in FIG. 3B. Therefore, the laser beam is not condensed into a spot in the projection optical system 6.

When the third embodiment is used for a scanning type projection exposure apparatus in which the wafer 8 is scanned and exposed to the circuit pattern on the reticle 5 in synchronism therewith, the scanning direction is selected to be in accord with the Z direction, by which the illumination light is made uniform with the result that the exposure can be effected with uniform light.

Figure 8:
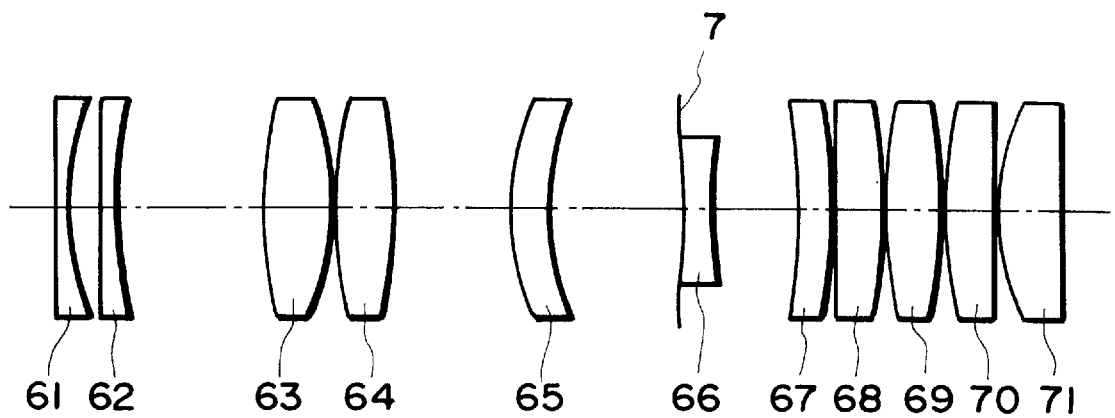
FIG. 8 shows an example of a projection optical system using a refraction optical system according to an embodiment of the present invention.

FIG. 8 shows an example of a projection optical system used in the first, second and third embodiments. In this example, nine lenses 61–71 are used, and the pupil plane (aperture) 7 is in proximity with the lens 66.

Figure 9:
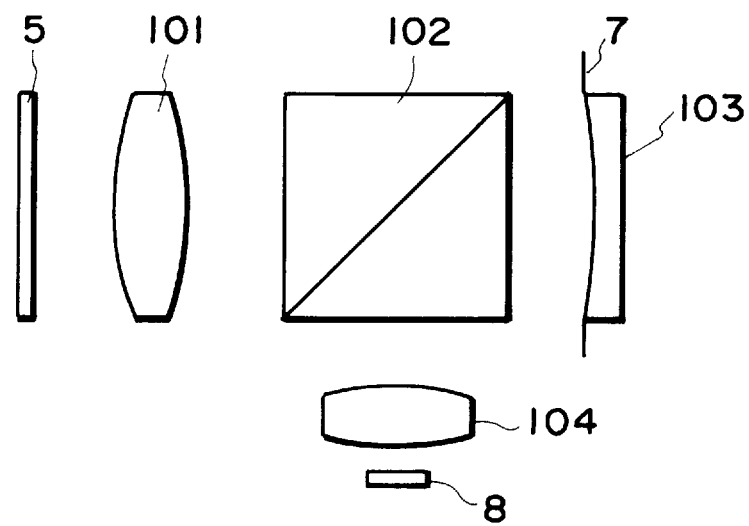
FIG. 9 shows an example of a projection optical system using a reflection and refraction optical system according to an embodiment of the present invention.

FIG. 9 shows another example of a projection optical system 6 usable with the first, second and third embodiments. The optical system shown in FIG. 10 comprises lens groups 101 and 104, a concave mirror 103, and a beam splitter 102, which constitute a reflection and refraction optical system. The light from the reticle 5 passes through the lens group 101 and the beam splitter 102 and is then reflected by the concave mirror 103. The light reflected by the concave mirror 103 is further reflected by the beam splitter 102 and is condensed on a wafer 8 by the lens group 104, so that the pattern of the reticle 5 is imaged on the wafer 8, in this optical system, the pupil plane (aperture plane) 7 is substantially in accord with the position of the concave mirror. In the projection optical system, the optical path is not folded by a mirror or the like, but it is possible to fold the optical path using a mirror or mirrors.

According to the foregoing embodiments, the spot-like condensation of the laser beam can be avoided in a projection optical system in an exposure apparatus using a high directivity such as a laser, and therefore, the durability of the optical elements at or adjacent the pupil plane, for example, against the laser beam can be improved.

Figure 10:
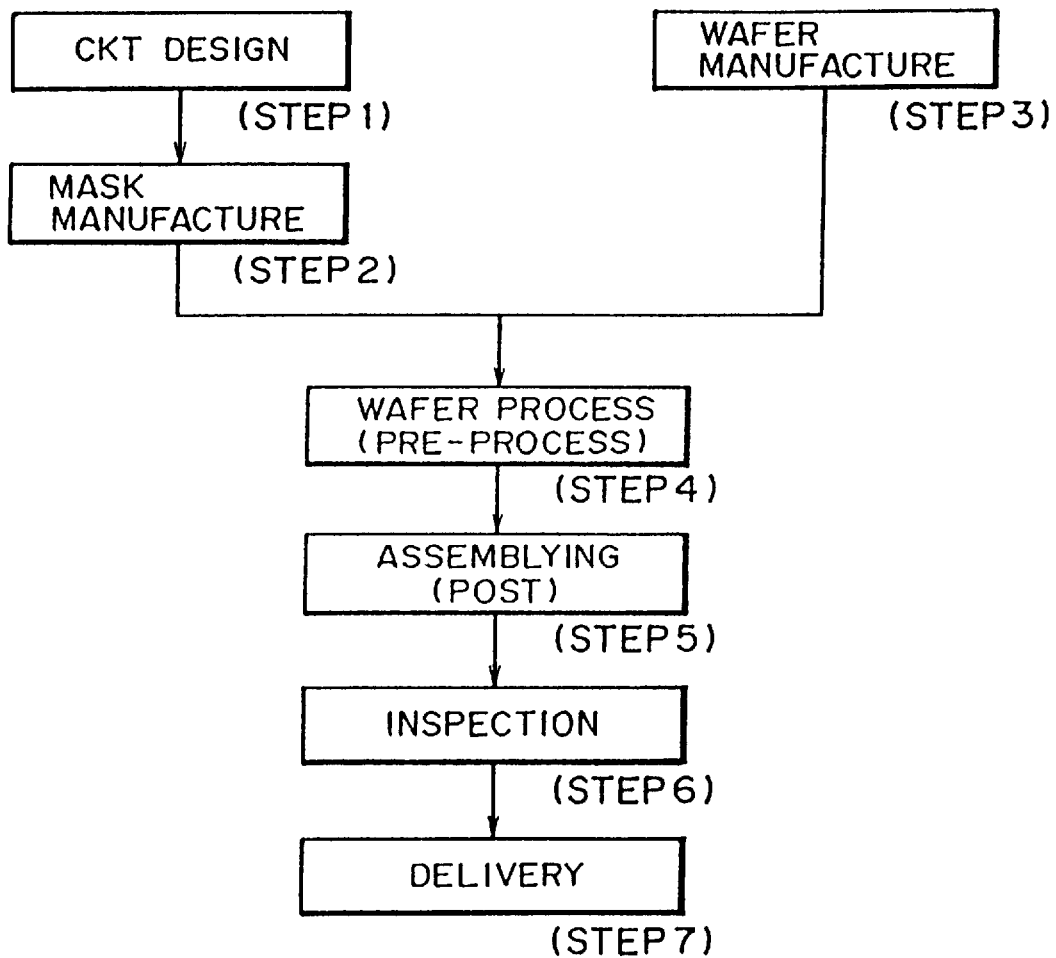
FIG. 10 is a flow chart for manufacturing a semiconductor device.

The description will now be made as to an embodiment of a device manufacturing method using the scanning exposure apparatus. FIG. 10 is a flow chart of manufacturing semiconductor devices such as ICs, LSIs or the like, or devices such as liquid crystal panels or CCDs or the like. At step 1, (circuit design), the circuits of the semiconductor device are designed. At step 2 (mask manufacturing), the mask (reticle 304) having the designed circuit pattern is manufactured. On the other hand, at step 3, a wafer (306) is manufactured using the proper material such as silicon. Step 4 (wafer processing) is called a pre-step, in which an actual circuit pattern is formed on a wafer through lithographic techniques using the prepared mask and wafer. At step 5 (post-step), a semiconductor chip is manufactured from the wafer subjected to the operations of step 4. The step 5 includes assembling steps (dicing, bonding), a packaging step (chip sealing) or the like. At step 6 (inspection), the operation of the semiconductor device manufactured by the step 5 is inspected, and a durability test thereof is carried out. In this manner, the semiconductor device is manufactured and delivered at step 7.

Figure 11:
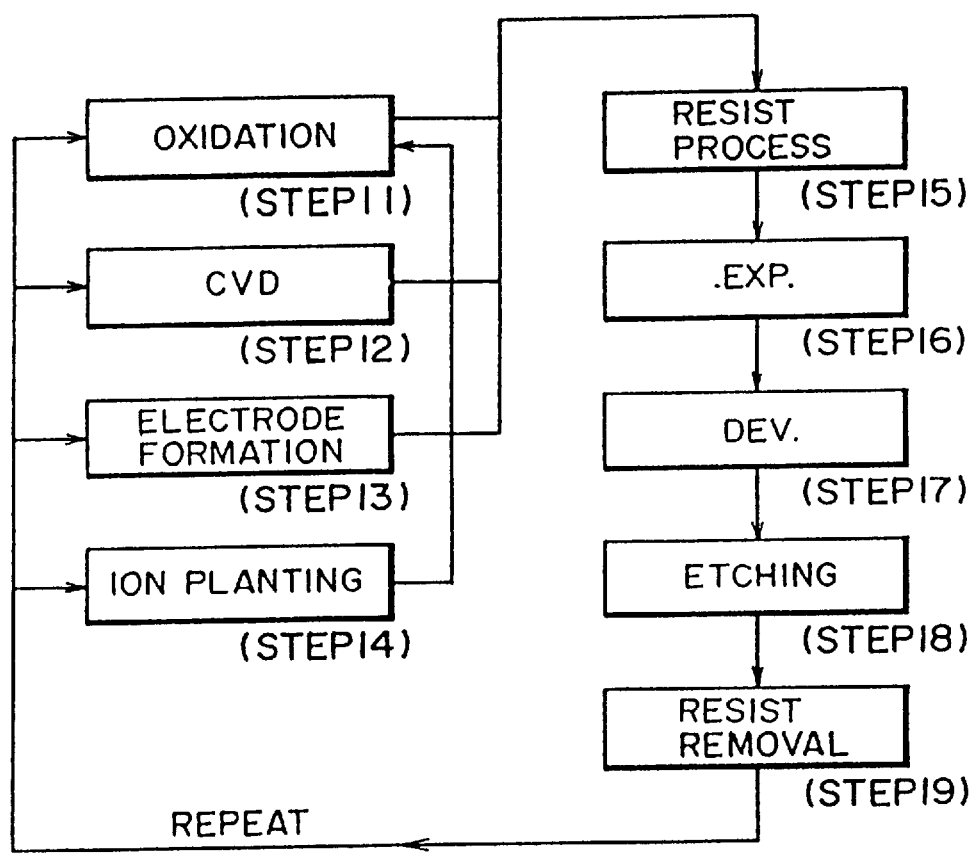
FIG. 11 is a flow chart of wafer processing shown in FIG. 10.

FIG. 11 is a flow chart of detailed wafer processing. At step 11 (oxidation), the surface of the wafer is oxidized. At step 12 (CVD), an insulating film is formed on a surface of the wafer. At step 13 (electrode formation), an electrode is formed on the wafer by evaporation. At step 14 (ion injection), the ions are implemented into the wafer. At step 15 (resist processing), a photosensitive material is applied on the wafer. At step 16 (exposure), the circuit pattern of the mask (reticle 304) is projected onto the wafer by the above-described exposure apparatus. At step 17 (development), the exposed wafer is developed. At step 18 (etching), the portion outside the resist image are removed. At step 19 (resist removal), the resist is removed after the etching. By repeating the above-described steps, overlaid circuit patterns are formed on the wafer.

According to the manufacturing method according to the embodiments of the present invention, the integration density can be improved.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus comprising:
    a projection optical system for projecting a pattern of a first object onto a second object;
    a laser source for emitting laser light;
    an optical integrator for forming a secondary light source by the laser light from said laser source; and
    a condenser optical system for illuminating the first object with the light from the secondary light source to project the pattern onto the second object, said condenser optical system imaging the secondary light source at positions which are different in a direction of an optical axis of said projection optical system with respect to two crossing planes, wherein the different positions are both on a second object side of the first object.

2. An apparatus according to claim 1, wherein the condenser optical system has refraction powers different in orthogonal directions.

3. An apparatus according to claim 1, wherein the first object and the second object are scanned with light, and an image of the secondary light source is formed adjacent a pupil of said projection optical system, and the image position in a direction perpendicular to the scanning direction is substantially in accord with the pupil, and the image position in the scanning direction is a predetermined distance away from the pupil of the projection optical system in the direction of the optical axis.

4. An apparatus according to claim 1, wherein the optical integrator comprises a plurality of lenses each having different refraction powers in two orthogonal directions.

5. A projection exposure apparatus comprising:
    a projection optical system for projecting a pattern of a first object onto a second object;
    a laser source for emitting laser light;
    an optical integrator for forming a secondary light source by the laser light from said laser source; and
    a condenser optical system for illuminating the first object with the light from the secondary light source to project the pattern onto the second object, said condenser optical system having an array of lenses, wherein rear focal positions of said lenses are different with respect to two crossing planes so as to image the secondary light source at positions which are different in a direction of an optical axis of said projection optical system with respect to the two crossing planes, said different Positions both being on a second object side of the first object.

6. An apparatus according to claim 5, wherein the first object and the second object are scanned with the laser light rays, wherein rear focus positions of said optical integrator in a direction perpendicular to the scanning direction is in optical conjugation with a pupil of said projection optical system.

7. A projection exposure apparatus comprising:
    an illumination optical system for illuminating a first object with light from a laser source; and
    a projection optical system for protecting a pattern of the first object onto a second object,
    wherein said illumination system images the light from the laser source at positions which are different in a direction of an optical axis of said projection optical system with respect to two crossing planes, said different positions both being on a second object side of the first object.

8. An apparatus according to claim 7, wherein said illumination optical system condenses the rays at the pupil of the projection optical system and at a position away from the pupil in the direction of the optical axis.

9. An apparatus according to claim 7, wherein said illumination optical system produces astigmatism.

10. An apparatus according to claim 8, wherein the first and second objects are scanned with light, the rays are condensed at the pupil in a plane including a direction perpendicular to the scanning direction and the optical axis, and at a position away from the pupil in a plane including the scanning direction and the optical axis.

11. A device manufacturing method comprising:
    projecting, using a projection optical system, a pattern of a first object onto a second object;
    emitting laser light from a laser source;
    forming, using an optical integrator, a secondary light source from the laser source; and
    illuminating, using a condenser optical system, the first object with the light from the secondary light source to project the pattern onto the second object, the condenser optical system imaging the secondary light source at positions which are different in a direction of an optical axis of the projection optical system with respect to two crossing planes, wherein the different positions are both on a second object side of the first object.

12. A device manufacturing method comprising:
    projecting, using a projection optical system, a pattern of a first object onto a second object;
    emitting laser light beam from a laser source;
    forming, using an optical integrator, a secondary light source by the laser light from the laser source; and
    illuminating, using a condenser optical system, the first object with the light from the secondary light source to project the pattern onto the second object, the condenser optical system having an array of lenses, wherein rear focal positions of the lenses are different with respect to two crossing planes so as to image the secondary light source at positions which are different in a direction of an optical axis of the projection optical system with respect to the two crossing planes, the different positions both being on a second object side of the first object.

13. A device manufacturing method comprising:
    illuminating, using an illumination optical system, a first object with light from a laser source; and
    projecting, using a projection optical system, a pattern of the first object onto a second object,
    wherein the illumination system images the light from the laser source at positions which are different in a direction of an optical axis of the projection optical system with respect to two crossing planes, the different positions both being on a second object side of the first object.

* * * * *

UNITED STATES PATENT AND TRADEMARK OFFICE
CERTIFICATE OF CORRECTION

PATENT NO. : 5,847,746
DATED : December 8, 1998
INVENTOR(S) : KAZUHIRO TAKAHASHI It is certified that error appears in the above-identified patent and that said Letters Patent is hereby corrected as shown below:

COLUMN 1:

line 28, "glass, materials" should read --glass materials--; and
    line 29, "decreases" should read --decrease--.

COLUMN 8:

line 55, "portion" should read --portions--.

COLUMN 9:

line 47, "Positions" should read --positions--.

Signed and Sealed this

Seventeenth Day of August, 1999

Attest:

Q. TODD DICKINSON

*Attesting Officer*          *Acting Commissioner of Patents and Trademarks*